(12) United States Patent
Chandhok et al.

(10) Patent No.: US 8,975,138 B2
(45) Date of Patent: Mar. 10, 2015

(54) METHOD OF CREATING A MASKLESS AIR GAP IN BACK END INTERCONNECTS WITH DOUBLE SELF-ALIGNED VIAS

(71) Applicants: Manish Chandhok, Beaverton, OR (US); Hui Jae Yoo, Hillsboro, OR (US); Yan A. Borodovsky, Portland, OR (US); Florian Gstrein, Portland, OR (US); David N. Shykind, Buxton, OR (US); Kevin L. Lin, Chandler, AZ (US)

(72) Inventors: Manish Chandhok, Beaverton, OR (US); Hui Jae Yoo, Hillsboro, OR (US); Yan A. Borodovsky, Portland, OR (US); Florian Gstrein, Portland, OR (US); David N. Shykind, Buxton, OR (US); Kevin L. Lin, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/931,219

(22) Filed: Jun. 28, 2013

(65) Prior Publication Data
US 2015/0001724 A1 Jan. 1, 2015

(51) Int. Cl.
| | |
|---|---|
| H01L 21/336 | (2006.01) |
| H01L 21/461 | (2006.01) |
| H01L 21/8234 | (2006.01) |
| H01L 23/535 | (2006.01) |
| H01L 21/768 | (2006.01) |

(52) U.S. Cl.
CPC ........ *H01L 23/535* (2013.01); *H01L 21/76879* (2013.01)

USPC .... 438/270; 438/268; 438/692; 257/E21.629; 257/E21.41

(58) Field of Classification Search
CPC .................................................. H01L 21/76879
USPC ........ 438/270, 268, 692; 257/E21.629, 21.41
See application file for complete search history.

(56) References Cited

U.S. PATENT DOCUMENTS

| | | | | |
|---|---|---|---|---|
| 6,413,872 | B1 * | 7/2002 | Kitch | 438/692 |
| 8,236,652 | B2 * | 8/2012 | Kim | 438/270 |
| 8,432,040 | B2 * | 4/2013 | Yu et al. | 257/774 |

* cited by examiner

*Primary Examiner* — Luan C Thai
(74) *Attorney, Agent, or Firm* — Blakely, Sokoloff, Taylor & Zafman LLP

(57) ABSTRACT

A method including patterning a thickness dimension of an interconnect material into a thickness dimension for a wiring line with one or more vias extending from the wiring line and introducing a dielectric material on the interconnect material. A method including depositing and patterning an interconnect material into a wiring line and one or more vias; and introducing a dielectric material on the interconnect material such that the one or more vias are exposed through the dielectric material. An apparatus including a first interconnect layer in a first plane and a second interconnect in a second plane on a substrate; and a dielectric layer separating the first and second interconnect layers, wherein the first interconnect layer comprises a monolith including a wiring line and at least one via, the at least one via extending from the wiring line to a wiring line of the second interconnect layer.

14 Claims, 5 Drawing Sheets

METHOD OF CREATING A MASKLESS AIR GAP IN BACK END INTERCONNECTS WITH DOUBLE SELF-ALIGNED VIAS

BACKGROUND

1. Field

Integrated circuit structures.

2. Description of Related Art

Integrated circuit structures generally include devices such as field effect transistors formed in or on a semiconductor substrate in combination with a multi-level interconnect structure with connections between different ones of the devices. A representative multi-level interconnect structure includes one or more arrays or levels of wiring lines to provide connections to and between devices. Closely spaced, generally parallel wiring lines, can provide undesirable level of capacitive coupling, particularly, for higher data transmission rates through the wiring lines. Such capacitive coupling can slow data transmission rates and increase energy consumption in a manner that can limit the performance of the integrated circuits.

One effort to reduce an undesirable level of capacitive coupling between adjacent wiring lines is modifying the dielectric material that separates the wiring lines. Specifically, efforts have been made to replace dielectric materials that have relatively high dielectric constants with materials having lower dielectric constants. Using air as a dielectric by forming, for example, air gaps between adjacent metal lines is one strategy. However, one issue surrounding the use of air gaps is unlanded vias. When conductive vias are misaligned with respect to wiring lines at, for example, a level below and land in an air gap, such misaligned vias reduce shorting margin or, in the worst case, can short adjacent lines. Undesired metal deposition in the air gap through an unlanded via also impacts interconnect reliability. Accordingly, efforts directed at introducing air gapped layers use masks to prevent formation of air gaps where vias are present. Use of masks, however, limits the implementation of air gaps, particularly, in lower interconnect levels where via density tends to be higher or in areas involving tight pitches.

DETAILED DESCRIPTION

Figure 1:
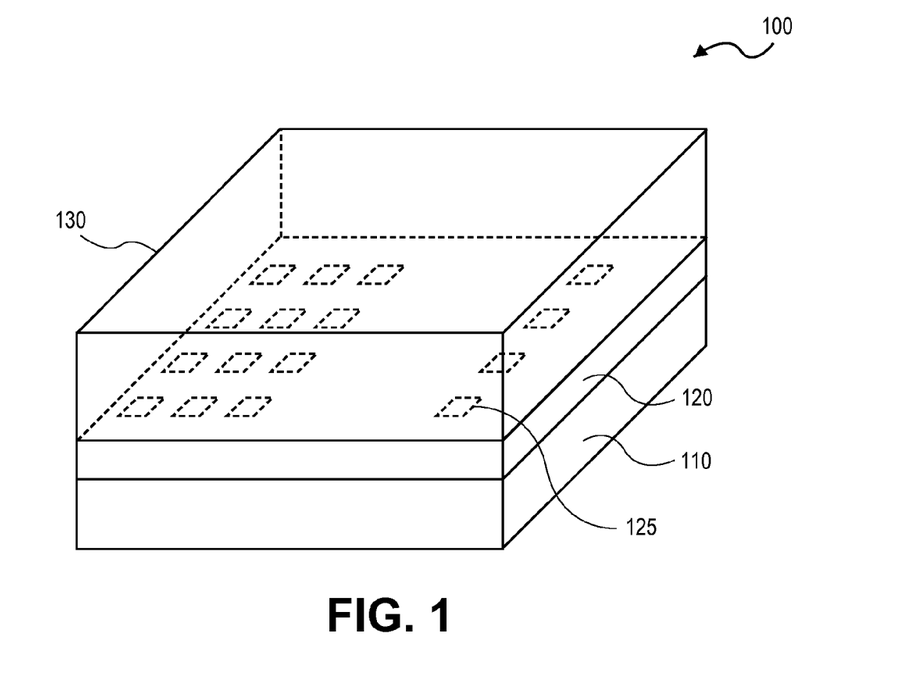
FIG. 1 shows a top, front side perspective view of a portion of an integrated circuit structure including a substrate and conductive vias to devices in or on the substrate and a dielectric material overlying the vias.

FIGS. 1-7 describe forming an integrated circuit structure including an interconnect structure or a multi-level interconnect structure on a device substrate and a technique for the provision of air gaps in the structure. FIG. 1 shows a top, front-side perspective view of a portion of an integrated circuit structure. Referring to structure 100, the structure includes substrate 110 of, for example, a semiconductor material (e.g., silicon). Representatively, substrate 110 includes a number of devices formed in/on the substrate (e.g., thousands to millions of devices). Overlying a device side of substrate 110 is dielectric layer 120. Dielectric layer 120 is, for example, a first level of dielectric material of, for example, carbon doped oxide (CDO). Extending through dielectric layer 120 are a number of conductive vias 125. Conductive vias 125 connect to devices formed on or in a device side of substrate 110 (e.g., vias connect to gates and junction regions of individual devices). A representative material for conductive vias 125 is copper.

FIG. 1 also shows dielectric material 130 disposed on dielectric layer 120. In one embodiment, dielectric material 130 is, for example, an interlayer dielectric (ILD) material such as CDO deposited conformally across the structure to a thickness at least equivalent to a thickness of an interconnect structure including wiring lines and subsequent level conductive vias. Representatively, a thickness of dielectric material that would encompass the wiring line and vias extending from that wiring line is roughly 1.8 times to two times that necessary to insulate a wiring line alone.

Figure 2:
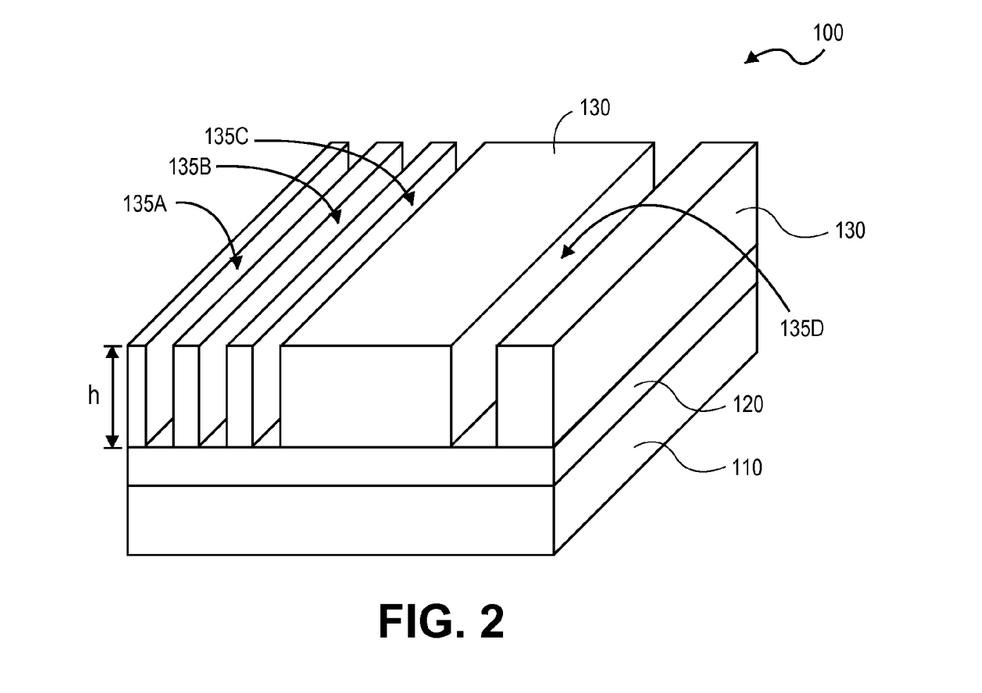
FIG. 2 shows the structure of FIG. 1 following the formation of trenches in dielectric material for desired wiring lines.

FIG. 2 shows the structure of FIG. 1 following the formation of trenches in dielectric material 130 for desired wiring lines. Representatively, trenches 135A-135D are formed over conductive vias 125 (see FIG. 1) to expose the vias. FIG. 2 shows representative trenches 135A, 135B, 135C and 135D. The trenches may be formed by photolithographic and etching techniques. Representatively, a masking material, such as a photoresist is placed on a surface of dielectric material 130 (a top surface as viewed) and developed to leave openings where trenches for metal lines are desired. Exposed dielectric material 130 of, for example, CDO, is then anisotropically etched using, for example, a fluorocarbon etchant. FIG. 2 shows the structure following the opening of trenches 135A-135D and the removal of any masking material.

Figure 3:
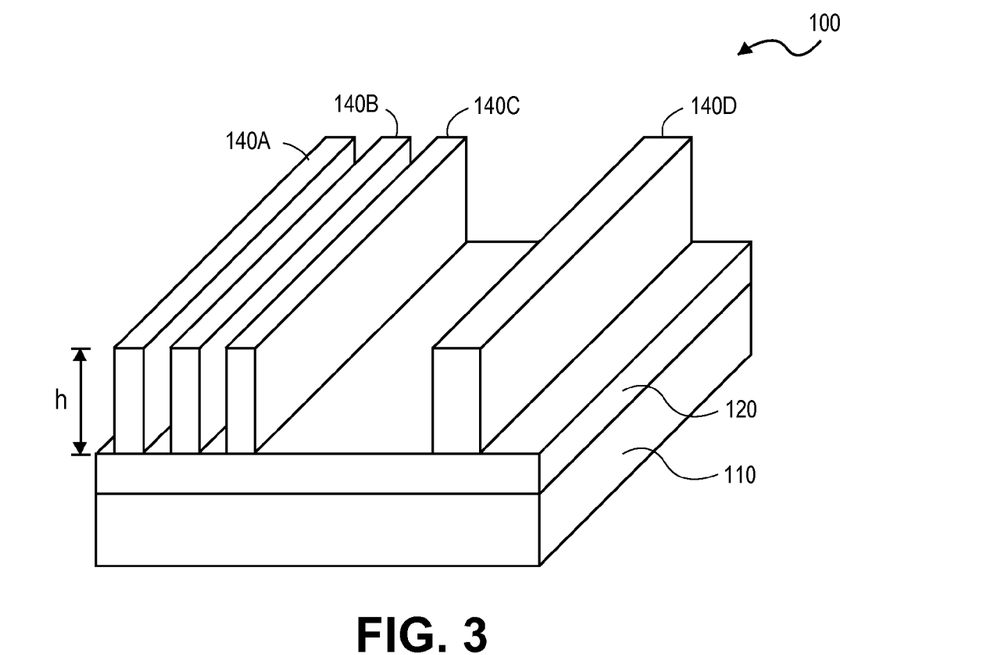
FIG. 3 shows the structure of FIG. 2 following the introduction of interconnect material in the trenches formed in dielectric material and the removal of the dielectric material.

FIG. 3 shows the structure of FIG. 2 following the introduction of interconnect material in the trenches formed in dielectric material 130. FIG. 3 shows interconnect structure 140A, interconnect structure 140B, interconnect structure 140C and interconnect structure 140D formed on dielectric layer 120 in trench 135A, trench 135B, trench 135C and trench 135D, respectively. The interconnect structures contact respective ones of vias 125 extending through dielectric layer 120 (see FIG. 1). In one embodiment, a material of interconnect structures 140A-140D is a semiconductor material such as silicon or polysilicon that will later be modified to increase its conductivity. Representatively, a material of interconnect structures 140A-140D that is silicon or polysilicon may be introduced by chemical vapor deposition.

Interconnect structures 140A-140B, in this embodiment, will individually be used to form a monolith of a wiring line and via ($M_xV_x$, where M represents a wiring level and V represents a via level). Thus, the thickness of height, h, of each of interconnect structures 140A-140D is, in one embodiment, [1-1.5] times the height of an interconnect material for a wiring line alone. Finally, FIG. 3 shows the structure following the removal of dielectric material 130. In one embodiment, dielectric material 130 of CDO for example, can be removed by a wet etch.

Figure 4:
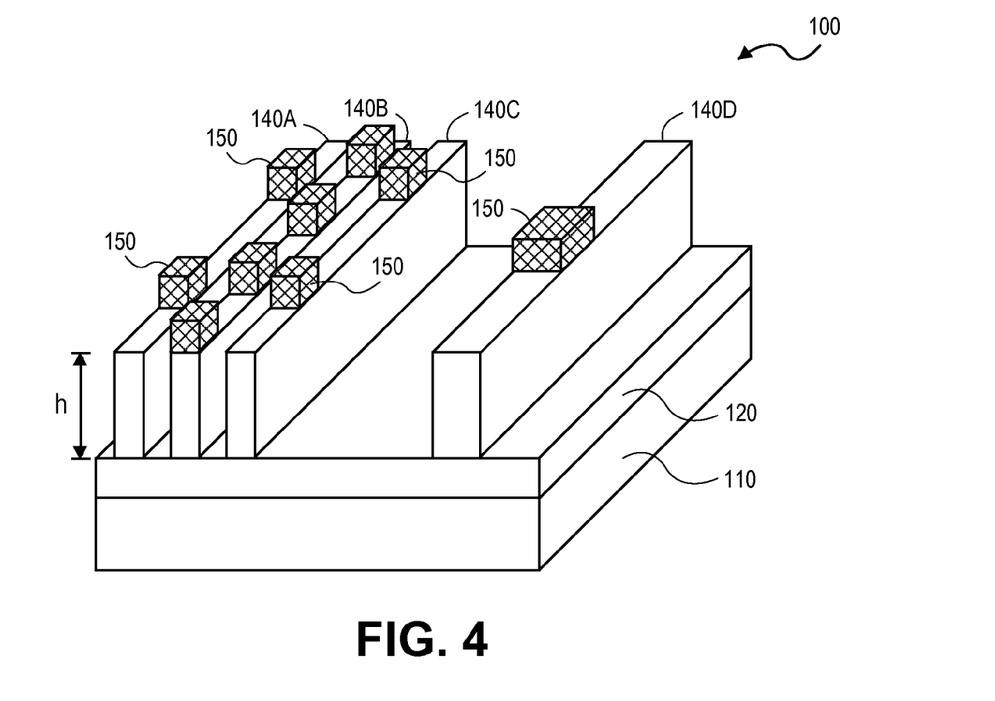
FIG. 4 shows the structure of FIG. 3 following the introduction of a masking material in areas of interconnect structures.

In one embodiment, the interconnect structures will be modified to include both a wiring line and vias extending or projecting from the wiring line to an area designated for a subsequent wiring line or wiring lines. For an interconnect structure material of silicon or polysilicon, modification to define a wiring line with one or more vias may be done through photolithographic and etching techniques. FIG. 4 shows the structure of FIG. 3 following the introduction of a masking material in areas of interconnect structures 140A-140D. In one embodiment, masking material 150 of, for example, a photoresist is introduced on areas of interconnect structures 140A-140D, where protection to define the vias is desired. Thus, the placement of masking material 150 will depend on desired areas for via contacts between the respective wiring line and a subsequent level of wiring line on structure 100.

Figure 5:
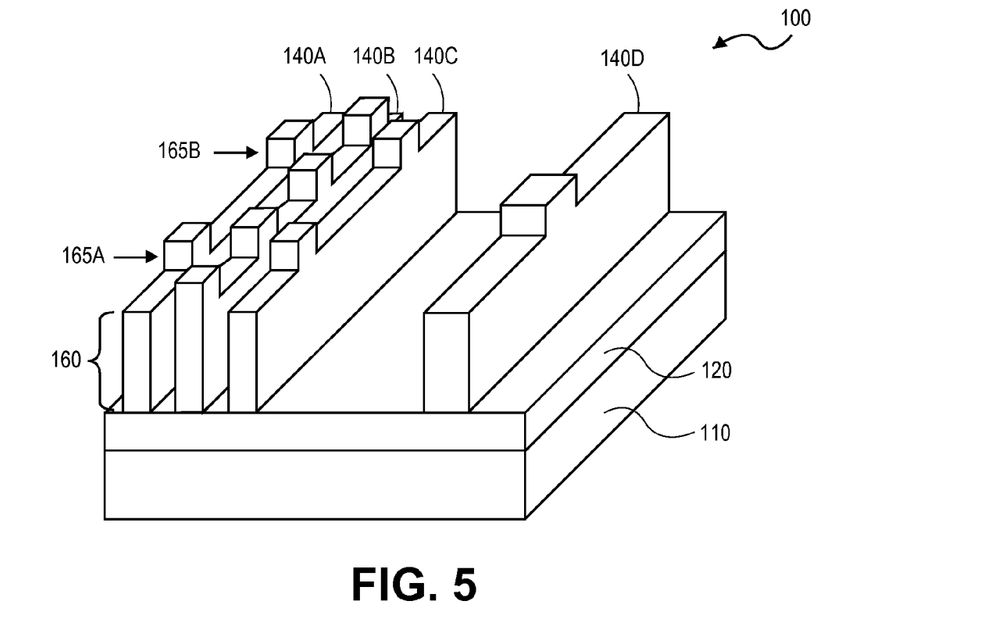
FIG. 5 shows the structure following the definition of interconnect structures including both a wiring line and vias.

FIG. 5 shows the structure following the definition of interconnect structures 140A-140D. Representatively, the individual interconnect structures are a monolith of both wiring line and one or more vias ($M_xV_x$). Representatively, interconnect structure 140A includes wiring line 160, representing, in this embodiment, a first level wiring line ($M_1$) and via 165A and via 165B extending or projecting from wiring line 160 as a second level via ($V_1$). Thus, the monolith includes the wiring line and via formed of a single structure (interconnect structure 140A). FIG. 5 also shows the structure following the removal of masking material 150.

Once interconnect structures 140A-140D are modified to include both a wiring line and one or more vias, the interconnect structure of, for example, silicon (mono/poly/amorphous) is silicided to increase the conductivity of the material. Representatively, a metal, such as nickel (Ni), cobalt (Co), or titanium (Ti), for example, may be introduced into the silicon by blanketing the structure with the metal and performing a thermal anneal.

Figure 6:
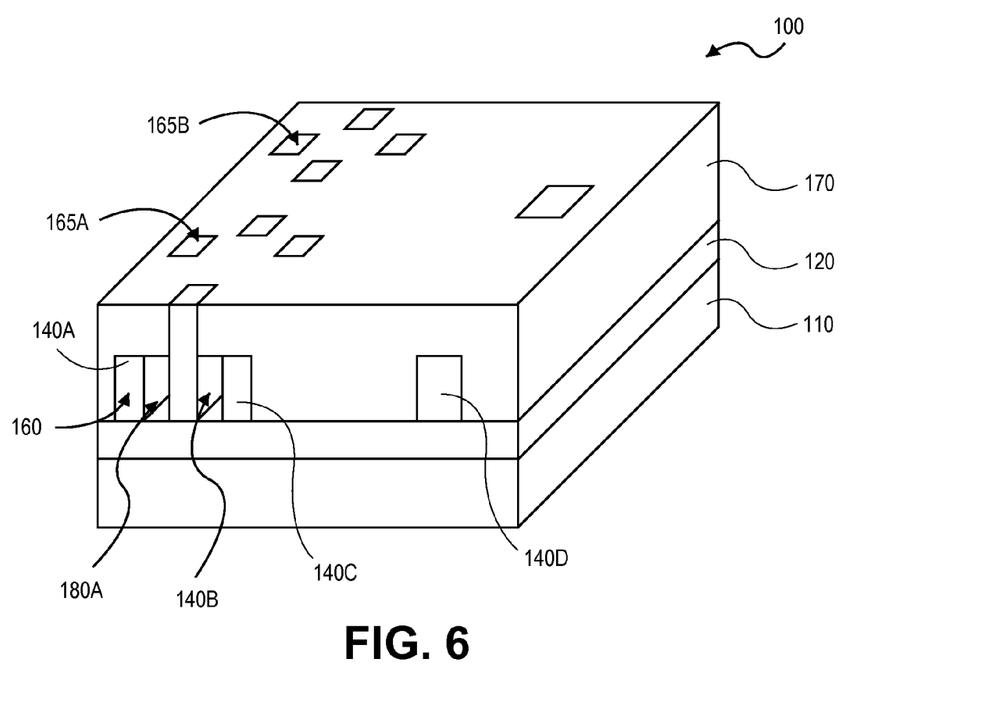
FIG. 6 shows the structure of FIG. 5 following the introduction of an interlayer dielectric layer on the structure.

FIG. 6 shows the structure of FIG. 5 following the introduction of an interlayer dielectric (ILD) layer. FIG. 6 shows ILD layer 170 formed on layer 120 and on the wiring line of interconnect structures 140A-140D. With respect to interconnect structure 140A, an end of wiring line 160 is visible in FIG. 6. Also, extending through a surface of ILD layer 170 are vias of each of interconnect structures 140A-140D. Representatively, via 165A and via 165B of interconnect structure 140A are exposed or extending from ILD layer 170 and available for connection to a subsequent metal layer.

FIG. 6 also shows establishment of air gaps. In one embodiment, interconnect structures 140A-140C are deposited with wiring lines adjacent to one another (relatively close to one another). A wiring line of interconnect structure 140D, on the other hand, is farther away from its nearest neighbor, interconnect structure 140C. A deposition of ILD layer 170 as a blanket over the structure will tend to produce air gaps between tightly spaced wiring line of interconnect structures and fill in wider spaces between wiring line of interconnect structures. FIG. 6 shows air gap 180A and air gap 180B formed in the first level represented by the wiring lines of interconnect structures 140A-140D. Representatively, air gap 180A is disposed between a wiring line of interconnect structure 140A and a wiring line interconnect structure 140B. Air gap 180B is defined between a wiring line of interconnect structure 140B and a wiring line interconnect structure 140C. As illustrated, it is the side walls of the wiring line and a surface of ILD layer 170 that creates the volume represented by the air gap. The separation distance (space) between two adjacent wiring lines can be a design parameter for having air gaps. For example, blanket deposition of CDO between the lines can be tuned to fill (no air gap), or not fill (air gaps) those spaces. In one embodiment, the maximum distance between adjacent wiring having air gaps is 2× metal line width.

By forming a wiring line and one or more vias from the same interconnect structure, the risk of unlanded vias is reduced. The vias are self-aligned to the lower wiring line (by way of the monolith) and are self-aligned to a subsequent wiring line in the sense that the vias are exposed in forming trenches for the subsequent wiring lines.

Figure 7:
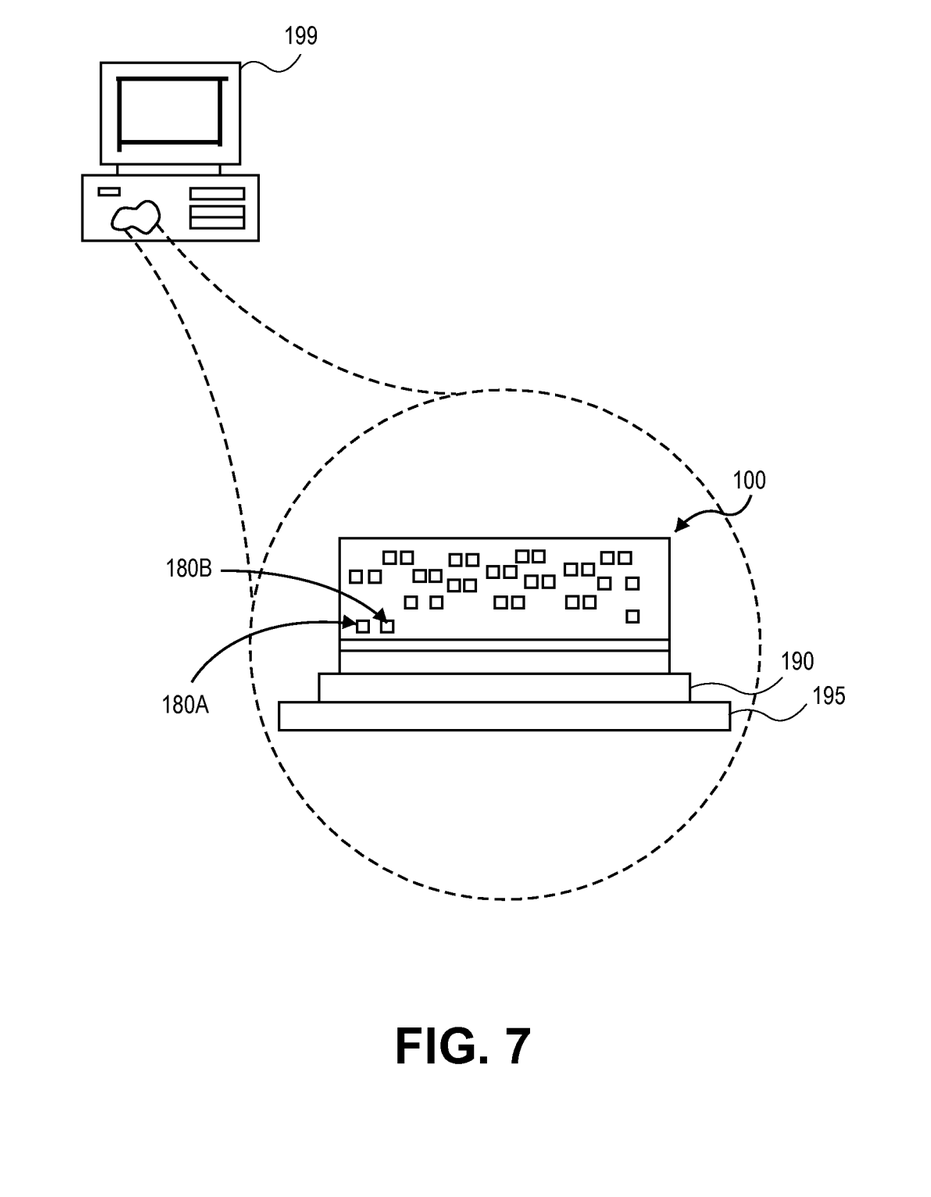
FIG. 7 shows the structure including multiple levels of wiring lines and air gaps disposed throughout the levels.

The above description describes the formation of interconnect structures as monoliths of both a wiring line and one or more vias. The discussion is directed at a first level wiring line, $M_1$ and a second level via, $V_1$. Similar procedures may be followed where desired for subsequent wiring layers or levels. FIG. 7 shows a cross-sectional side view of structure 100 including multiple levels of wiring lines and air gaps (illustrated by air gap 180A and air gap 180B) disposed throughout the levels. Structure 100, in this embodiment, is, for example, a processor connected to package substrate 190 and the collective package (structure 100 and package substrate 190) connected to circuit board 195 which are representatively assembled in, for example, computing device 199 of, for example, a personal computer.

Figure 8:
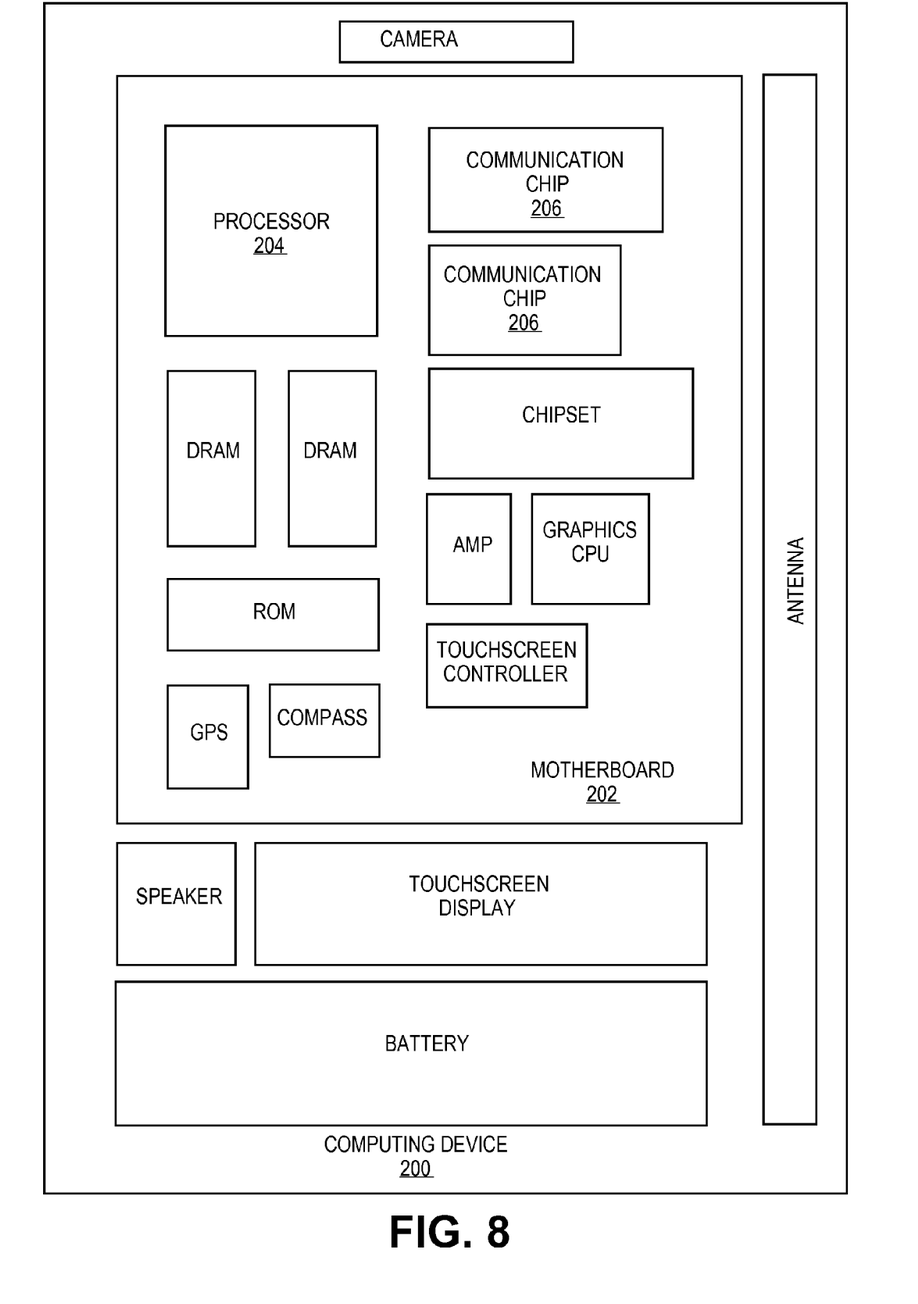
FIG. 8 illustrates a computing device in accordance with one implementation.

FIG. 8 illustrates a computing device 200 in accordance with one implementation. The computing device 200 houses board 202. Board 202 may include a number of components, including but not limited to processor 204 and at least one communication chip 206. Processor 204 is physically and electrically connected to board 202. In some implementations at least one communication chip 206 is also physically and electrically connected to board 202. In further implementations, communication chip 206 is part of processor 204.

Depending on its applications, computing device 200 may include other components that may or may not be physically and electrically connected to board 202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 206 enables wireless communications for the transfer of data to and from computing device 200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 200 may include a plurality of communication chips 206. For instance, a first communication chip 206 may be dedicated to shorter range wireless communications such as Wi-Fi and Bluetooth and a second communication chip 206 may be dedicated to longer range wireless communications such as GPS, EDGE, GPRS, CDMA, WiMAX, LTE, Ev-DO, and others.

Processor 204 of computing device 200 includes an integrated circuit die packaged within processor 204. In some implementations, the integrated circuit die includes a multi-level interconnect including monoliths of wiring lines and vias to that allows for air gaps in the interconnect assembly such as described with reference to FIGS. 1-6. The term "processor" may refer to any device or portion of a device that processes electronic data from registers and/or memory to transform that electronic data into other electronic data that may be stored in registers and/or memory.

Communication chip 206 also includes an integrated circuit die packaged within communication chip 206. In accordance with another implementation, a package including a communication chip incorporates one or more capacitors such as described above.

In further implementations, another component housed within computing device 200 may contain a microelectronic package including an integrated circuit die such as described above.

In various implementations, computing device 200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 200 may be any other electronic device that processes data.

EXAMPLES

The following examples pertain to embodiments.

Example 1 is a method including patterning an interconnect material on a integrated circuit substrate, the interconnect material comprising length and width dimensions selected for a wiring line; patterning a thickness dimension of the interconnect material into a thickness dimension for a wiring line with one or more vias extending from the wiring line; and introducing a dielectric material on the interconnect material such that the one or more vias are exposed through the dielectric material.

In Example 2, patterning the interconnect material on a integrated circuit substrate in the method of Example 1 includes introducing a dielectric material on the substrate; forming an opening in the dielectric material, the opening comprising length and width dimensions for a wiring line; depositing the interconnect material in the opening in the dielectric material; and removing a portion of the dielectric material to expose the interconnect material.

In Example 3, patterning a thickness dimension of the interconnect material in the method of Example 1 includes masking areas of the interconnect material selected for the one or more vias; and etching portions of the interconnect material to remove interconnect material in areas other than masked areas.

In Example 4, etching in the method of Example 1 includes etching the interconnect material from a first thickness dimension to a second thickness that is a thickness dimension for a wiring line.

In Example 5, the interconnect material in the method of Example 1 includes silicon and prior to introducing a dielectric material, the method comprises modifying the silicon to a silicide.

In Example 6, patterning an interconnect material on an integrated circuit substrate in the method of Example 1 includes patterning a first interconnect material and a second interconnect material, wherein the each of the first interconnect material and the second interconnect material comprise length and width dimensions selected for a wiring line and wherein introducing a dielectric material on the interconnect material comprises introducing the dielectric material on each of the first interconnect material and the second interconnect material, with adjacent sidewalls of the first interconnect material and the second interconnect material and the interconnect material defining a volume exclusive of dielectric material.

Example 7 is a method including depositing an interconnect material on an integrated circuit substrate comprising a plurality of devices; patterning the interconnect material into a wiring line and one or more vias with the one or more vias extending a distance from the wiring line to an area designated for a subsequent wiring line; and introducing a dielectric material on the interconnect material such that the one or more vias are exposed through the dielectric material.

In Example 8, wherein prior to depositing the interconnect material in the method of Example 7 includes forming an opening in a dielectric layer on the substrate, the opening comprising length and width dimensions for a wiring line; depositing the interconnect material in the opening in the dielectric material; and removing a portion of the dielectric material to expose the interconnect material.

In Example 9, patterning the interconnect material in the method of Example 7 including masking areas of the interconnect material selected for the one or more vias; and etching portions of the interconnect material to remove interconnect material in areas other than masked areas.

In Example 10, etching in the method of Example 7 includes etching the interconnect material from a first thickness dimension to a second thickness that is a thickness dimension for a wiring line.

In Example 11, the interconnect material in the method of Example 7 includes silicon and prior to introducing a dielectric material, the method comprises modifying the silicon to a silicide.

In Example 12, depositing an interconnect material on an substrate in the method of Example 7 includes depositing a first interconnect material and a second interconnect material, wherein the each of the first interconnect material and the second interconnect material comprise length and width dimensions selected for a wiring line and wherein introducing a dielectric material on the interconnect material comprises introducing the dielectric material on each of the first interconnect material and the second interconnect material, with adjacent sidewalls of the first interconnect material and the second interconnect material and the interconnect material defining a volume exclusive of dielectric material.

Example 13 is an apparatus including a circuit substrate; a first interconnect layer in a first plane on the substrate and a second interconnect in a different second plane on the substrate; and a dielectric layer separating the first interconnect layer and the second interconnect layer, wherein the first interconnect layer comprises a monolith comprising a wiring line and at least one via, the at least one via extending from the wiring line to a wiring line of the second interconnect layer.

In Example 14, the first interconnect layer in the apparatus of Example 13 includes a first monolith and a second monolith separated from the first monolith by a gap, wherein a volume of the gap comprises a portion free of dielectric material.

In Example 15, the monolith in the apparatus of Example 13 includes a silicide.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A method comprising:
    patterning a first interconnect material on a device layer of an integrated circuit substrate, the first interconnect material comprising length and width dimensions selected for a wiring line;
    patterning a thickness dimension of the first interconnect material into a thickness dimension for a first wiring line with one or more vias extending from the wiring line;
    introducing a dielectric material on the first interconnect material such that the one or more vias are exposed through the dielectric material; and
    after introducing the dielectric material, patterning a second interconnect material into a second wiring line coupled to one or more of the vias.

2. The method of claim 1, wherein patterning the interconnect material on a integrated circuit substrate comprises:
    introducing a dielectric material on the substrate;
    forming an opening in the dielectric material, the opening comprising length and width dimensions for a wiring line;
    depositing the interconnect material in the opening in the dielectric material; and
    removing a portion of the dielectric material to expose the interconnect material.

3. The method of claim 1, wherein patterning a thickness dimension of the interconnect material comprises:
    masking areas of the interconnect material selected for the one or more vias; and
    etching portions of the interconnect material to remove interconnect material in areas other than masked areas.

4. The method of claim 1, wherein etching comprises etching the interconnect material from a first thickness dimension to a second thickness that is a thickness dimension for a wiring line.

5. A method comprising:
    patterning an interconnect material on an integrated circuit substrate, the interconnect material comprising length and width dimensions selected for a wiring line;
    patterning a thickness dimension of the interconnect material into a thickness dimension for a wiring line with one or more vias extending from the wiring line; and
    introducing a dielectric material on the interconnect material such that the one or more vias are exposed through the dielectric material,
    wherein the interconnect material comprises silicon and prior to introducing a dielectric material, the method comprises modifying the silicon to a silicide.

6. The method of claim 1, wherein patterning an interconnect material on an integrated circuit substrate comprises patterning a first interconnect material and a second interconnect material, wherein the each of the first interconnect material and the second interconnect material comprise length and width dimensions selected for a wiring line and wherein introducing a dielectric material on the interconnect material comprises introducing the dielectric material on each of the first interconnect material and the second interconnect material, with adjacent sidewalls of the first interconnect material and the second interconnect material and the interconnect material defining a volume exclusive of dielectric material.

7. A method comprising:
    depositing an interconnect material on an integrated circuit substrate comprising a plurality of devices;
    patterning the interconnect material into a first wiring line and one or more vias with the one or more vias extending a distance from the first wiring line to an area designated for a second wiring line;
    introducing a dielectric material on the interconnect material such that the one or more vias are exposed through the dielectric material; and
    after introducing the dielectric material, coupling a second wiring line to one or more of the vias.

8. The method of claim 7, wherein prior to depositing the interconnect material, the method comprises:
    forming an opening in a dielectric layer on the substrate, the opening comprising length and width dimensions for a wiring line;
    depositing the interconnect material in the opening in the dielectric material; and
    removing a portion of the dielectric material to expose the interconnect material.

9. The method of claim 7, wherein patterning the interconnect material comprises:
    masking areas of the interconnect material selected for the one or more vias; and
    etching portions of the interconnect material to remove interconnect material in areas other than masked areas.

10. The method of claim 7, wherein etching comprises etching the interconnect material from a first thickness dimension to a second thickness that is a thickness dimension for a wiring line.

11. A method comprising
    depositing an interconnect material on an integrated circuit substrate comprising a plurality of devices;
    patterning the interconnect material into a wiring line and one or more vias with the one or more vias extending a distance from the wiring line to an area designated for a subsequent wiring line; and
    introducing a dielectric material on the interconnect material such that the one or more vias are exposed through the dielectric material, wherein the interconnect material comprises silicon and prior to introducing a dielectric material, the method comprises modifying the silicon to a silicide.

12. A method comprising:
depositing a first interconnect material and a second interconnect material on an integrated circuit substrate comprising a plurality of devices;
patterning each of the first interconnect material and the second interconnect material into a respective wiring line and one or more respective vias with the one or more respective vias extending a distance from the wiring line to an area designated for a subsequent wiring line; and
introducing a dielectric material on the first interconnect material and the second interconnect material such that the one or more respective vias are exposed through the dielectric material,
wherein introducing a dielectric material comprises introducing the dielectric material on each of the first interconnect material and the second interconnect material, with adjacent sidewalls of the first interconnect material and the second interconnect material and the interconnect material defining a volume exclusive of dielectric material.

13. An apparatus comprising:
a circuit substrate;
a first interconnect layer in a first plane on the substrate and a second interconnect layer in a different second plane on the substrate; and
a dielectric layer separating the first interconnect layer and the second interconnect layer,
wherein the first interconnect layer comprises a first monolith and a second monolith, wherein the first monolith comprises a wiring line and at least one via, the at least one via extending from the wiring line to a wiring line of the second interconnect layer, and wherein the second monolith is separated from the first monolith by a gap, wherein a volume of the gap comprises a portion free of dielectric material of the dielectric layer.

14. The apparatus of claim 13, wherein the monolith comprises a silicide.

* * * * *